US006723388B2

(12) United States Patent
Svendsen et al.

(10) Patent No.: US 6,723,388 B2
(45) Date of Patent: Apr. 20, 2004

(54) METHOD OF DEPOSITING NANOSTRUCTURED FILMS WITH EMBEDDED NANOPORES

(75) Inventors: Leo G. Svendsen, San Francisco, CA (US); Shyama P. Mukheriee, Morgan Hill, CA (US); Paul J. Roman, Jr., San Ramon, CA (US); Ross H. Hill, Coquitlam (CA); Harold O. Madsen, Rio Rancho, NM (US); Xin Zhang, Burnaby (CA); Donna Hohertz, Vancouver (CA)

(73) Assignee: EKC Technology, Inc., Hayward, CA (US)

( * ) Notice: Subject to any disclaimer, the term of this patent is extended or adjusted under 35 U.S.C. 154(b) by 24 days.

(21) Appl. No.: 10/261,197

(22) Filed: Sep. 30, 2002

(65) Prior Publication Data

US 2003/0118743 A1 Jun. 26, 2003

Related U.S. Application Data

(63) Continuation-in-part of application No. 09/918,908, filed on Jul. 30, 2001, now Pat. No. 6,458,431.
(60) Provisional application No. 60/221,844, filed on Jul. 28, 2000.

(51) Int. Cl.$^7$ ............................................. C23C 14/04
(52) U.S. Cl. ..................... 427/526; 427/243; 427/245; 427/256; 427/377; 427/380; 427/383.1; 427/421; 427/430.1; 427/529; 427/530; 427/531; 427/535; 427/551; 427/552; 427/557; 427/558; 427/576; 427/595
(58) Field of Search ................................ 427/243, 552, 427/245, 557, 256, 558, 377, 576, 380, 595, 383.1, 421, 430.1, 526, 529, 530, 531, 535, 551

(56) References Cited

U.S. PATENT DOCUMENTS

| 5,534,312 A | 7/1996 | Hill et al. .................... 427/533 |
| 5,851,507 A | 12/1998 | Pirzada et al. .............. 423/659 |
| 5,952,040 A | 9/1999 | Yadav et al. ............. 427/126.3 |
| 5,984,997 A | 11/1999 | Bickmore et al. ............ 75/343 |
| 6,380,105 B1 | 4/2002 | Smith et al. ................ 438/778 |

OTHER PUBLICATIONS

G. Counio, et al., "$Cd_{1-x}Mn_xS$ Nanoparticles ($x \leq 5\%$) in Sol–Gel Matrices," Electrochem. Soc. Proceedings, vol. 97–11, pp. 35–46 (1997), (no month avail.).

(List continued on next page.)

Primary Examiner—Bernard Pianalto
(74) Attorney, Agent, or Firm—Pennie & Edmonds LLP

(57) ABSTRACT

This invention comprises methods for making nanostructured and nanoporous thin film structures of various compositions. These films can be directly patterned. In these methods, precursor films are deposited on a surface and different components of the precursor film are reacted under selected conditions, forming a nanostructured or nanoporous film. Such films can be used in a variety of applications, for example, low k dielectrics, sensors, catalysts, conductors or magnetic films. Nanostructured films can be created: (1) using one precursor component and two reactions, (2) using two or more components based on differential rates of photochemical conversion, (3) using two precursors based on the thermal sensitivity of one precursor and the photochemical sensitivity of the other, and (4) by photochemical reaction of a precursor film and selected removal of a largely unreacted component from the film.

18 Claims, 5 Drawing Sheets

OTHER PUBLICATIONS

Y. Yonezawa, et al., "Formation of silver metal films by photolysis of silver salts of high molecular weight carboxylic acids," Thin Solid Films, 218 (1992) 109–121, (no month avail.).

International Search Report for International Application No. PCT/CA01/01094, International filing date Jul. 3, 2001.

J. Bravo–Vasquez, et al., "The Photolithographic Deposition of Nanostructured Materials," Polymeric Materials Science and Engineering, vol. 81, (1999) pp. 16–17, (no month avail.).

METHOD OF DEPOSITING NANOSTRUCTURED FILMS WITH EMBEDDED NANOPORES

CROSS-REFERENCE TO RELATED APPLICATIONS

The present application is a continuation-in-part of U.S. application Ser. No. 09/918,908, filed Jul. 30, 2001, now U.S. Pat. No. 6,458,431, which claims priority to Provisional Patent Application No. 60/221,844, filed Jul. 28, 2000, each of which is hereby incorporated herein by reference.

FIELD OF THE INVENTION

This invention is directed to film compositions, structure applications, and methods for making nanostructured and nanoporous films of metals or metal oxides. These films are derived from precursor formulations containing metal-organic compounds. Throughout this document "nanostructured films" refers to thin films with nanoparticles in the structure or nanoscale domain structure, and "nanoporous films" refers to thin films with pores with diameters in the nanometer range. The invention also relates to the use of such films in a variety of applications, including but not limited to those that apply to the microelectronics industry.

BACKGROUND OF THE INVENTION

Semiconductors are widely used as the basis for forming integrated circuits for use in electronic devices such as computers, televisions, PDAs, radios, cell phones, etc. These integrated circuits typically combine millions of transistors on a single crystal silicon chip to perform complex functions and to store data. Due to the continuing trend of miniturization as well as other industry demands, semiconductor microelectronic designers require integrated circuits that are (1) higher in speed, (2) well-controlled for film nanoconstituents or nanoparticles and the resulting nanostructure, and (3) lower in cost.

1. Achieving Higher Speed in Microelectronic Circuits

One way to make the integrated circuits faster is to reduce signal cross talk. Cross talk signals are signals on a first conductor wire that couple to a second conductor wire in close proximity to the first conductor wire and create incorrect signals on the second conductor wire. Decreasing the capacitance between the conductor wires will reduce cross talk signals. The capacitance between the conductor wires can be decreased by decreasing the insulator dielectric constant of the materials between the conductor wires. Many insulator dielectric constant reduction schemes are being studied, such as using acrogel films (which are nanoporous dielectric films where the solid dielectric material has many voids that are filled with air). In U.S. Pat. No. 6,380,105, "Low volatility solvent-based method for forming thin film nanoporous aerogels on semiconductor substrates," a fabrication method for thin film nanoporous dielectric materials is disclosed. However, these films are formed using normal VLSI (Very Large Scale Integration) techniques, which makes the films difficult to pattern and produces variable results in terms of controlling their porosity because (1) the photoresists normally applied to image a VLSI film fill the voids with an unwanted residual and (2) the solvent chemistry that is used to remove the photoresist fills the voids with unwanted residual solvents. It is difficult to remove these unwanted residual photoresist materials and residual solvent chemistry. Thus there exists a need to control the porosity of a nanoporous film as well as to be able to easily pattern these films without creating difficult to remove residuals.

(2) Controlling Film Nanoconstituents or Nanoparticles and Resulting Nanostructure in Microelectronic Circuits Another need in VLSI processing and design is the need to control the nanostructure of a film. Indeed, advanced design thin films for use in VLSI, such as metal or insulative diffusion barriers, conductive electrodes for capacitors, wiring conductors, thin film resistors, thin film fuses, thin film magnetic films and thin film dielectric materials, attempt to control the nanoconstituents or nanoparticles. By controlling the nanoparticles in these thin films one may control the final nanostructure of the film.

(3) Achieving Lower Costs in Microelectronic Circuits

Another need in VLSI design and manufacture is to simplify the process of producing circuits on semiconductor substrates. It is also beneficial to simplify the process without increasing the cost of manufacture, preferably lowering the manufacturing cost. In the traditional VLSI approach, a necessary series of process steps involves the photolithography process that defines patterns in films. This is also a large cost in the traditional VLSI approach. Basically, for every film patterned in VLSI, a photoresist needs to be exposed and imaged, developed and used as a mask to transfer the image through a Reactive Ion Etch (RIE) and then the unwanted photoresist is removed using a plasma $O_2$ ash or a wet solvent strip followed by a cleaning step to remove photoresist residuals. Indeed, one can see that defining a pattern on any film layer used in VLSI is costly just from the sheer number of steps. In U.S. Pat. No. 5,534,312, "Method for directly depositing metal containing patterned films," a photoresist-free method for making patterned films of metal oxides, metals, or other metal containing compounds is described. Specifically this process is a method of photochemical metal organic deposition (PMOD).

The method involves applying an amorphous film of a metal-organic compound to a substrate. The film may be conveniently applied by spin coating using standard industry techniques. The metal-organic compound used is photoreactive and undergoes a low temperature chemical reaction initiated by light of a suitable wavelength. The end product of the reaction depends upon the atmosphere in which the reaction is carried out. For example, metal oxide films may be made in air. Films may be patterned by exposing only selected portions of the film to light. Patterns of two or more materials may be laid down from the same film by exposing different parts of the film to light in different atmospheres. The resulting patterned film is generally planar, eliminating the need for separate planarization steps. It has been found that this PMOD technique can be applied to create controlled nanoporous or nanostructured films. As can be seen, this process indeed simplifies the overall process and creates a lower cost VLSI processing method. As noted above, nanoporosity is a desirable characteristic in certain films for improving qualities such as dielectric constant. However, because the '312 patent does not address nanoporous films nor the control of nanoporosity in such films, there still exists a need to combine the simplified, low-cost PMOD method of creating patterned films used in VLSI with a way to effectively control nanoporosity in a film.

SUMMARY OF THE INVENTION

The present invention discloses a method for the controlled deposition of nanoporous or nanostructured thin films. The process consists of first depositing a precursor film on a substrate. The precursor formulation may be deposited on the surface by a variety of methods, such as spin coating. The deposition may be carried out at room temperature. The next step is converting the precursor solution into a metal or metal oxide film.

To create a nanostructured film according to the present invention, a least one of the components of the precursor formulation is partially or fully converted to a metal or metal oxide. This is followed by the conversion of the second component. At least one of these two conversion steps may be accomplished by photolysis (decomposition of precursor film via photochemical reaction of the precursor compound) or by the impact of an ion or an electron beam. The resulting film created is a well-controlled, nanostructured thin film where each component can be independently controlled. During the conversion step, a light, ion, or electron beam is imaged through a mask. The resulting thin film has regions where the conversion step caused a reaction and in other regions there will be no reaction. Therefore, by use of a mask or directed beam, the nanostructured metal or metal oxide film is patterned.

By altering the atmosphere in which the pattern is formed, the composition and resulting nanostructure and hence the thin film properties of the resulting metal or metal oxide film can be altered. The process also includes the atmospheric reaction being performed (1) before, (2) during, or (3) after, the light, ion, or electron beam conversion step or (4), any combination of (1), (2) or (3).

By making a nanostructured film where one component is easily removed, a nanoporous film may be prepared. Additionally, process related variables such as those described herein may be used to influence the porosity of the photolyzed film.

DETAILED DESCRIPTION OF THE PREFERRED EMBODIMENTS

Figure 1:
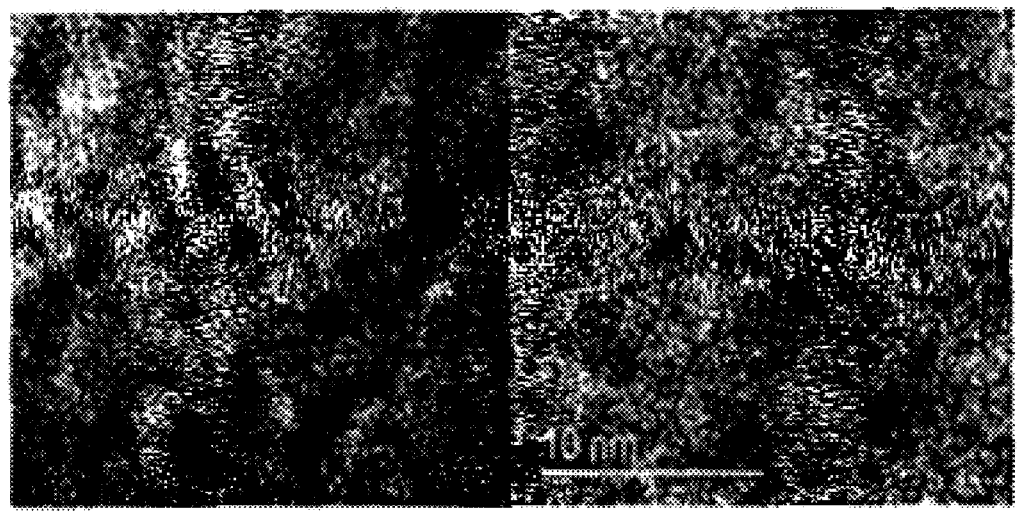
FIG. 1 is a transmission electron microscope image of manganese and tantalum regions.

The present invention discloses a method of making a nanostructured thin film, including depositing a precursor solution on a substrate and then converting the precursor into a thin film. The thin film is then treated, such that the process is designed to have different reactions of the different components forming metal oxide at different times during the process, allowing for the controlled formation of different material compositions during the method. At least one of the steps in the method involves the interaction of either directed light, or ion beam, or electron beam allowing for pattern definition in the thin film.

The controlled construction of these nanostructured thin films allows control over various physical properties of the final thin film. These thin films may be deposited on various substrates. Application examples of these substrates include, but are not limited to: simple salts, such as $CaF_2$; crystals like sapphire or quartz; semiconductor surfaces, such as silicon or gallium arsenide; metals like platinum, copper, or aluminum, as on the upper layers of a semiconductor structure; and insulators like $SiO_2$ or polymers; and packaging surfaces, such as ceramics (e.g. alumina) and polymers (e.g. polyimide).

The nature of the substrate is not critical for the process, although it may affect the method of deposition of the precursor film chosen, with respect to temperature ranges, adhesion properties and the solvent for deposition. The most commonly used substrate has been silicon wafers or the upper layers of a semiconductor structure.

The precursor film, for example a 2000 angstrom film of $Ti(OiPr)_2(acac)_2$, may be deposited on the substrate, for example silicon, by a variety of methods, like spin coating. In this method, the precursors are dispersed in a solvent to form a precursor solution. In one example, the substrate, a preprocessed semiconductor silicon wafer, is held in place with a vacuum chuck such as present in a commercial spin coater (i.e., from Headway or Laurell Corporation). The precursor solution is dispensed onto the surface of the substrate either before commencing spinning or while the substrate is spinning. The substrate is then allowed to spin resulting in the deposition of a thin film of the precursor on the surface. The thickness of the thin film has an optimal range of 1 micron to 200 nm and a possible range of 10 microns to 50 nm. This thickness may be adjusted, as is known in the spin coating art, by adjusting parameters such as the rate of spin of the substrate, the viscosity of the precursor solution, and the concentration of the precursor solution. It should be noted that the thickness is considerably reduced from thickness of first application through subsequent exposure steps. For example, an oxide typically results in an 8–10×reduction in thickness and a metal typically results in a 50–100×reduction in thickness after all exposure steps. In some cases, the rate of feed of the solution is also a factor. In one example, the spin coating is carried out at room temperature.

Several parameters can be controlled to effect the residual nonsocial porosity of the photolyzed films, including the precursor chemistry, the solvent used for coating the substrate, pre-treatment of the deposited film, and the thickness of the deposited film. For example, the higher degree of photoactivity of the selected precursor, the lower the volume fraction of porosity in the photolyzed film. This is evident with the binary system of Ba-Hexanoate and Ti (acac)2(iPr) 2.

As another example, the solvent used for spin-coating the precursor onto a substrate has an influence on the initial packing density of the precursors constituents generated during the drying of the solvents. In principle, solvents with lower surface tension make the dried films less dense compared with films dried from solvents having higher surface tension. The capillary force is directly proportion to the surface tension and inversely proportional to the capillary radius. This force influences the collapsing of pores generated during the drying of the deposited film and, thereby, influences the nanoporosity of the resulting film.

For instance, a lower surface tension solvent such as hexane will produce less dense films than a higher surface tension solvent such as cyclohexanone or MIBK. The film can inherit this initial density difference after photolysis.

As yet another example of variables that can be controlled to influence the nanoporosity of photolyzed films of the present invention, a baking step before UV exposure can introduce additional porosity due to the network formation before the densification during UV exposure. As still another example of variables that effect nanoporosity, the porosity of the photolyzed film is proportional to the film thickness, the thinner the film, the less the porosity when the radiation dose is the same. Conversely, as the film thickness increases, the porosity of the film increases when the radiation dose is the same.

Figure 3:
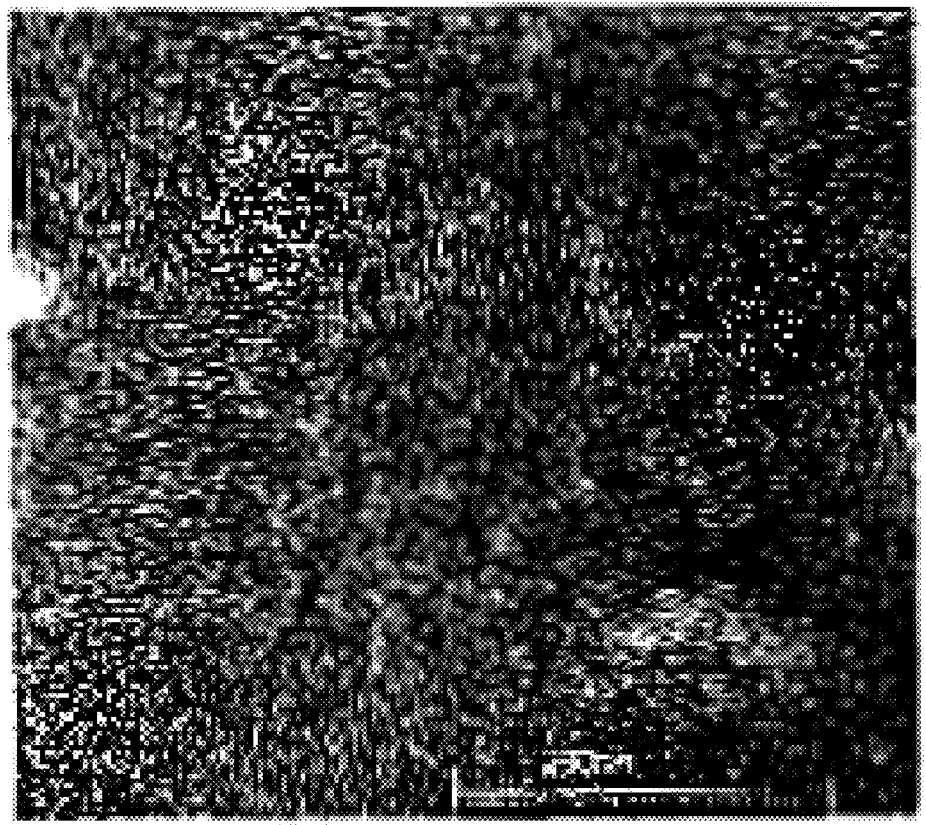
FIG. 3 is a transmission electron microscope image of a manganese oxide film.
Figure 4A:
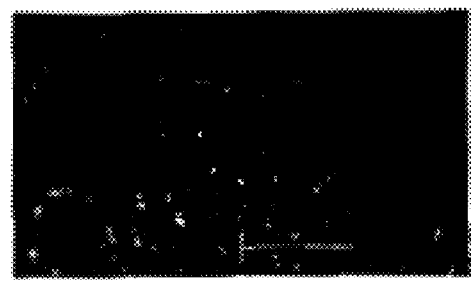
FIG. 4A is a transmission electron microscope image of a manganese oxide film prepared with a 1:1 molar ratio of manganese:lauric acid.
Figure 4B:
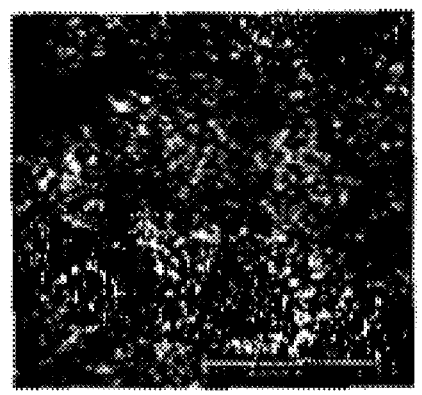
FIG. 4B is a transmission electron microscope image of a manganese oxide film prepared with a 100:1 molar ratio of manganese:lauric acid.
Figure 4C:
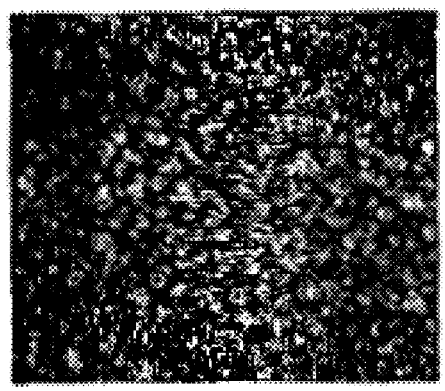
FIG. 4C is a transmission electron microscope image of a manganese oxide film prepared with a 1000:1 molar ratio of manganese:lauric acid.

As another example, the addition of surfactants in a range of concentrations can also effect the nanostructure of films. The nature of the surfactant is also important, especially, if the surfactant is going to be left within the film. For example, a film formed in the process described in U.S. Pat. No. 5,534,312, which is incorporated by reference herein, a sample preprared by the photolysis of a manganese 2-ethylhexanoate film is shown in FIG. 3. The only remarkable feature shown is a graininess composed of small rounded features approximately 4 nm in diameter. Pure manganese 2-ethylhexanoate films can be photolyzed with 254 nm radiation leaving a film of amorphous oxide. These films could also be patterned lithographically using a mask. By adding surfactants, such as lauric acid, to the precursor film, the density and appearance of the features change, as shown in FIGS. 4A–4C.

Figure 5A:
FIG. 5A is a transmission electron microscope image of a manganese oxide film prepared with a 1:1 molar ratio of manganese:NaAOT.
Figure 5B:
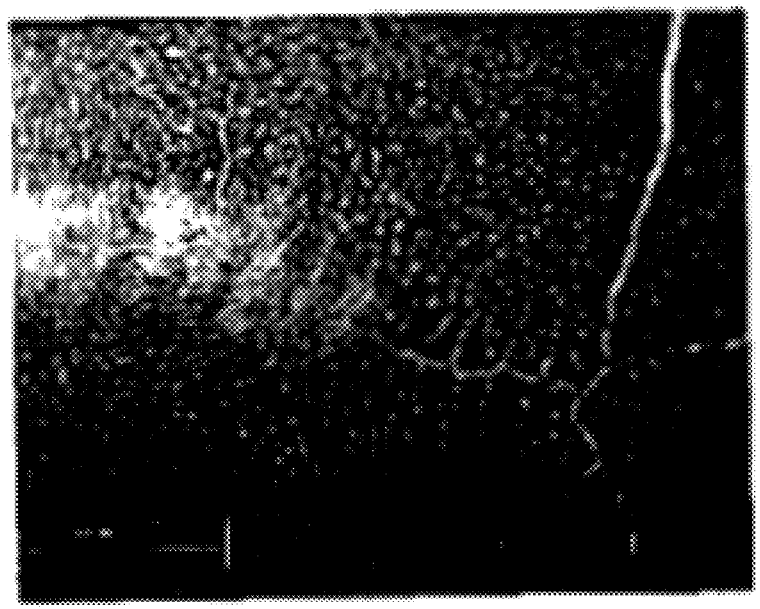
FIG. 5B is a transmission electron microscope image of a manganese oxide film prepared with a 100:1 molar ratio of manganese:NaAOT.

Other or multiple surfactants or metals may be used. Another suitable surfactant is NaAOT. Zirconium precursors can be used to prepare zirconium oxide/surfactant mixtures on both titanium and tantalum precursors can be used to produce films and the phase separation properties are modified by the addition of surfactants such as NaAOT. The surfactant NaAOT may also be used with manganese to generate nanostructuring. By varying the molar ratios of manganese and NaAOT, for example, the nanostructure can be effected, as shown in FIGS. 5A and 5B.

Where both thermal and photochemical conversion processes are used, either conversion process may be employed first dependent upon the chemical system used.

The foregoing variables that can effect the porosity of the photolyzed film are not intended to constitute an exhaustive list of such variables but, rather, are exemplary variables that can effect the porosity of the photolyzed film.

A first embodiment of the invention for creating nanostructured films is by using one precursor component and two reactions as follows. A precursor is selected such that the primary structure of the precursor lowers the barrier to formation of short-range secondary order, i.e. formation of nanocrystalline domains.

EXAMPLE 1

In an example of this first embodiment, a barium titanium double metal alkoxide (nominal composition is BaTi(OR)x) precursor formulation is prepared by dissolving the precursor in a suitable solvent (preferably 5–50% (w/w) and possibly 1–90% (w/w)). The formulation is applied as described above in the "initial basic method for deposition of precursors." Then the resulting film is converted in a single photolysis step. The resulting metal oxide film is treated under hydrothermal conditions such as digesting the solution under a selected pressure and temperature in the presence of a suitable catalyst or in absence of a catalyst in an autoclave. This hydrothermal treatment produces a film having nanocrystalline domains in a matrix of amorphous metal oxide(s).

A second embodiment of the invention for creating nanostructured films is by using two or more components selected based on differential rates of photochemical conversion is as follows. In this embodiment, the two precursors are selected, such that their different rates of photochemical deposition lead to deposition of nanoscale domains of the individual compounds.

EXAMPLE 2

In an example of this second embodiment, a sample consisting of Ta(OEt)$_4$(acac) (acac=2,4-pentanedionate) (18% by weight), and zirconium(IV) 2-ethylhexanoate (29% by weight) in MIBK (methyl isobutyl ketone) is used to coat a substrate by conventional spin coating methods. This step is followed by photolysis for 30 minutes using deep UV radiation (preferably 254 nm), as described in the U.S. Pat. No. 5,534,332 patent. The light source in this example may be a Xe lamp or a Hg vapour lamp, such as a 100 W high pressure Hg vapour lamp in an Oriel™ housing equipped with condenser lenses and a 10 cm water filter with quartz optics. A HeCd laser emitting light at 325 nm and/or 416 nm has useful properties for use as a light source in association with many metal complexes." The UV radiation step results in the reaction of primarily the tantalum film. This is followed by development with hexanes for 5 minutes, which results in the formation of a pattern. Further photolysis for 2 hours results in the reaction of the zirconium precursor component and the formation of a nanostructured film. In a similar example, the remaining zirconium is made to react thermally, subsequent to the developing of the film.

EXAMPLE 3

In another example of this second embodiment, a mixture of barium(2-ethylhexanoate) and Ti(OiPr)$_2$(acac)$_2$(21.5% w/w and 18.5% w/w, respectively) in MIBK is used to coat a silicon substrate by spin coating. The coated substrate is exposed to deep UV radiation for 30 minutes. By using lithographic methodology (i.e., patterned exposure of the substrate) a patterned film is generated using a mixture of hexane and isopropyl alcohol (10:90) to develop the latent image.

For the purpose of confirming the composition of the film, the resulting barium-titanium oxide film samples were placed in a 30° C. water bath for thirty minutes of processing. The film samples were removed from the water and the water was analyzed by inductively coupled plasma mass spectrometry (ICP-MS). The water showed high levels of barium and no titanium. This result shows that the barium was selectively leached from the sample and also suggests speciation of barium oxide and titanium oxide (e.g., formation of discrete domains) in the film.

The fact that the barium is selectively extracted from the film suggests that the barium is not included in a secondary structure with titanium (such as a perovskite structure found in crystalline phases of barium titanate). For example, when a film of barium titanate is subjected to the same conditions as in the example above, no barium or titanium are leached from the film.

A third embodiment of the invention for creating nanostructured films is by using two precursors selected based on the thermal sensitivity of one precursor and the photochemical sensitivity of the other. In this embodiment, the two precursors that are selected have the appropriate thermal and photochemical sensitivity such that it is possible to first separate one then the other then the first from the precursor film.

EXAMPLE 4

In an example of this third embodiment, a mixture of barium(2-ethylhexanoate) and Ti(OiPr)$_2$(acac)$_2$(21.5% w/w and 18.5% w/w, respectively) in MIBK is used to coat a silicon substrate by spin coating. The coated substrate is heated on a 90° C. hot plate for 2 minutes resulting in thermal decomposition of the titanium precursor. Subsequent exposure of the film to deep UV radiation results in decomposition of the barium precursor. By using lithographic methodology (i.e., patterned exposure of the substrate) a patterned film is generated using a mixture of hexane and isopropyl alcohol (10:90) to develop the latent image.

The same testing method used in Example 3 was performed on the films created in Example 4, leading to the same conclusion, that barium and titanium are separate in order for the barium to have leached, and barium oxide and titanium oxide are what is predicted/expected in the film.

EXAMPLE 5

In another example of this third embodiment, a sample consisting of a mixture made from Ta(OEt)$_4$(acac) and Mn(II) 2-ethylhexanoate (16% by weight of each) in heptane is spin coated upon a silicon substrate. The sample reacts in the dark at room temperature by a thermal process that causes a reaction, primarily of the tantalum precursor. This is followed by a photochemical reaction of the manganese precursor by exposing the film to deep UV radiation. By using lithographic methodology (i.e., patterned exposure of the substrate) a patterned film is generated using hexanes to develop the latent image.

FIG. 1 shows a TEM of the resultant nanostructured film with manganese and tantalum regions of the resultant method. The TEM image showing the manganese regions in bright is shown on the left and the concentration of tantalum in the darker areas on the right. The elemental analysis of the TEM images is determined by EDX (energy dispersive x-ray spectroscopy) or EELS (electron energy loss spectroscopy). Both images are consistent with separation of tantalum and manganese from each other. (The scale for each image is the same and is shown on the bright field image.)

EXAMPLE 6

In yet another example of this third embodiment, a mixture made from Ta(OEt)$_4$(acac) (18% by weight) and uranyl hexanoate (9% by weight) in MEK (methylethyl ketone) is used to coat a substrate by spin coating. The tantalum-containing complex is reacted thermally at room temperature. The next step is to photochemically react the uranyl compound. By using lithographic methodology (i.e., patterned exposure of the substrate) a patterned film is generated using acetone to develop the latent image.

Figure 2:
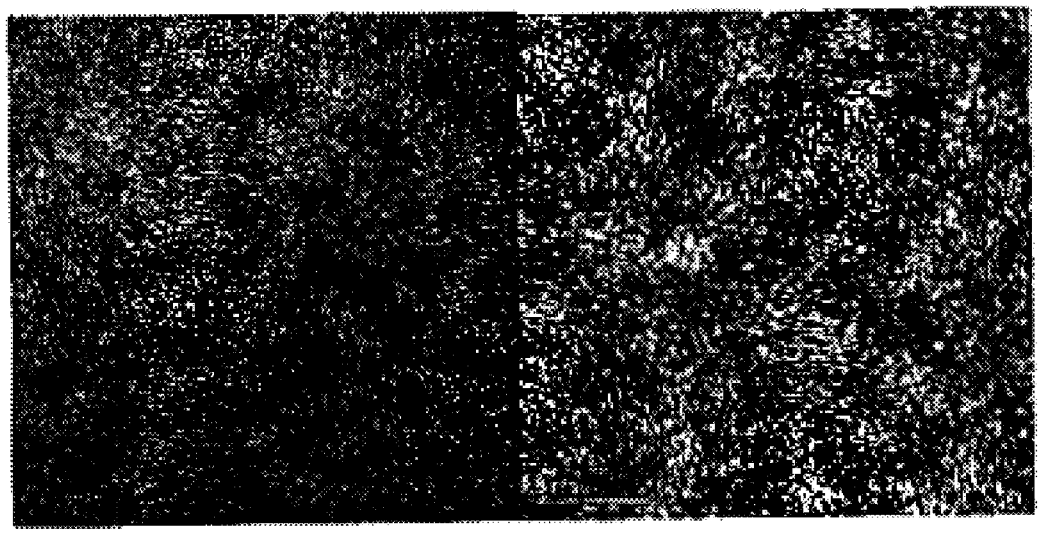
FIG. 2 is a transmission electron microscope image of uranium rich regions.

FIG. 2 shows a TEM of uranium rich regions of the resultant nanostructured film of the method above. The left side of FIG. 2 shows the uranium map for a sample. In this image the uranium containing regions are brighter. The right side of FIG. 2 shows the bright field image for this sample at the same magnification. In FIG. 2, the uranium rich regions are brighter. These two images indicate a separation of the two components on a nanometer size scale.

A fourth embodiment of the invention for creating nanoporous thin films is by the photochemical reaction of a precursor film and selectively removing a largely unreacted component from the film. In this embodiment, it is demonstrated that the different processes used may affect the nanostructure and influence the porosity of the final film. In addition by choosing one component of the precursor formulation such that it is largely unreacted by the photochemical decomposition of the metal containing precursor(s) and that it can be selectively removed from the converted film, a highly porous film can be formed. The extent and nature of the porosity may be controlled by the amount and nature of this component.

It has been discovered that the method of PMOD described in the '312 patent can be used to create some degree of nanoporosity upon photolysis. However, this embodiment describes a method where additional porosity, not necessarily in the same scale as the inherent porosity through the PMOD method, is created. The choice of a proper precursor, such as a low density oxide as discussed in U.S. application Ser. No. 09/918,908, can provide this nanoporosity. This process, in conjunction with appropriate choice of additives with silica, one can make photo-patterned low-k dielectric films, which are of technological importance as discussed above in the "Related Art" section with respect to U.S. Pat. No. 6,380,105, which is incorporated herein by reference.

EXAMPLE 7

In an example of this fourth embodiment, a sample made from Ta(OEt)$_4$(acac) (24.8% by weight) and 1,3-dicyclohexylcarbodiimide (6.7% by weight) in MIBK is spin coated onto a substrate. Photolysis for approximately 30 min using deep UV radiation results in the reaction of primarily the tantalum film. This is followed by development with hexanes for 5 minutes, resulting in the formation of a patterned thin film. The 1,3-dicyclohexylcarbodiimide trapped within the thin film is removed by contact with hexanes. The resultant patterned thin film is nanoporous (determined by SEM analysis). Alternatively, the 1,3-dicyclohexylcarbodiimide is removed by thermal treatment of the film resulting from photolysis of the Ta(OEt)$_4$(acac).

EXAMPLE 8

In another example of this fourth embodiment, a precursor formulation consisting of a mixture of Ta(OEt)$_4$(acac) (15% by weight) and urea (5% by weight) in ethanol is used to coat a substrate by spin coating. Photolysis for 30 minutes using deep UV radiation results in the reaction of primarily the tantalum film. This step is followed by development with ethanol for 5 minutes time, which results in the formation of a patterned thin film. The urea trapped within the film is removed by contact with ethanol during the development of the pattern. The resultant patterned film is nanoporous (determined by SEM analysis). Alternatively, the adipic acid is removed by thermal treatment of the film resulting from photolysis of the tantalum precursor.

EXAMPLE 9

In yet another example of this fourth embodiment, a sample of made from Ta(OEt)$_4$(acac) (10% by weight) and adipic acid (5% by weight) in ethanol is used to coat a substrate with a spin coating process. The primary result of subsequent photolysis for about 30 minutes using deep UV radiation is the reaction of the tantalum film. This is followed by development with ethanol for 5 minutes, which resulted in the formation of a patterned thin film. The adipic acid trapped within the film is removed by contact with ethanol. The resultant patterned film is nanoporous (determined by SEM analysis). Alternatively, the adipic acid is removed by thermal treatment of the film resulting from photolysis of the tantalum precursor.

Although the present invention has been described with particular reference to its preferred embodiments, it should be understood that these embodiments are illustrative and that the invention may be modified and practiced in different but equivalent manners apparent to those skilled in the art having the benefit of the teachings herein. It is therefore evident that the particular embodiments disclosed above may be altered or modified in ways that such variations are considered within the scope and spirit of the invention. Therefore, the scope of the invention should not be limited by the specific disclosure herein, but only by the appended claims.

What is claimed is:

1. A method of depositing nanostructured films comprising one or more metals or metal oxides with embedded nanopores, said method comprising;

depositing a film of a metal-ligand precursor solution on a substrate; and photochemically reacting the film to form a nanostructured film with nanopores.

2. The method of claim 1 wherein the film is patterned.

3. A method of depositing films comprising one or more metals or metal oxides with embedded nanopores, said method comprising:

depositing a film of a metal complex precursor solution on a surface of a substrate; and converting the precursor solution deposited on the substrate to a metal or metal oxide film with embedded nanopores wherein the conversion is done at least partially photochemically.

4. The method of claim 3 wherein the deposited film within which the nanopores are embedded is amorphous.

5. The method of claim 4 wherein the depositing is done by spin coating, spraying, dip coating or inking.

6. The method of claim 3 wherein the conversion is at least partially done hydrothermally.

7. The method of claim 3 wherein the conversion is at least partially done with a plasma, electron beam, or ion beam.

8. The method of claim 3 wherein the film is sequentially converted in two or more steps.

9. The method of claim 3 wherein the conversion is at least partially done with ultraviolet light.

10. The method of claim 3 wherein the metal or metal oxide film formed by the conversion step is patterned.

11. The method of claim 10 wherein the conversion is at least partially done thermally.

12. The method of claim 10 wherein the conversion is at least partially done hydrothermally.

13. The method of claim 10 wherein the conversion is at least partially done with a plasma, electron beam, or ion beam.

14. The method of claim 10 wherein the conversion is at least partially done with ultraviolet light.

15. The method of claim 3 wherein the conversion is at least partially done in an oxygen atmosphere.

16. The method of claim 3 wherein the conversion is at least partially done thermally.

17. The method of claim 3 wherein at least one surfactant is added to the precursor solution.

18. The method of claim 3 wherein a baking step is used after depositing and prior to converting said film.

* * * * *